United States Patent
Tang et al.

(10) Patent No.: US 10,482,967 B1
(45) Date of Patent: Nov. 19, 2019

(54) LAYOUT STRUCTURE OF LOCAL X-DECODER

(71) Applicant: Wuhan Xinxin Semiconductor Manufacturing Co., Ltd., Wuhan, Hubei Province (CN)

(72) Inventors: Yuan Tang, San Jose, CA (US); Jen-Tai Hsu, San Jose, CA (US)

(73) Assignee: Wuhan Xinxin Semiconductor Manufacturing Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/198,854

(22) Filed: Nov. 22, 2018

(51) Int. Cl.
  *G11C 16/06* (2006.01)
  *G11C 16/08* (2006.01)
  *G11C 16/14* (2006.01)

(52) U.S. Cl.
  CPC ............. *G11C 16/08* (2013.01); *G11C 16/14* (2013.01)

(58) Field of Classification Search
  CPC ................................. G11C 16/08; G11C 16/14
  USPC ..................................................... 365/185.18
  See application file for complete search history.

(56) References Cited

U.S. PATENT DOCUMENTS

| | | | | |
|---|---|---|---|---|
| 2011/0194362 A1* | 8/2011 | Lu | ............ | G11C 8/08 365/189.11 |
| 2013/0135931 A1* | 5/2013 | Namai | ............ | G11C 16/0483 365/185.11 |

* cited by examiner

*Primary Examiner* — Huan Hoang
(74) *Attorney, Agent, or Firm* — Winston Hsu

(57) ABSTRACT

A two-sided memory array is disclosed. Each side includes four local x-decoders. Each local x-decoder includes: a first pair of cascode transistors coupled to a first signal; a second pair of cascode transistors coupled to the first signal, a second signal, and a word line; a third transistor coupled to the first signal; and a third pair of cascode transistors coupled to the second signal, a third signal, and the word line. All transistors in each local x-decoder are disposed vertically, and P-channels and N-channels on each side of the memory array are disposed in an order corresponding to P-channels of a first local x-decoder, P-channels of a second local x-decoder, P-channels of a third local x-decoder, P-channels of a fourth local x-decoder, N-channels of the fourth local x-decoder, N-channels of the third local x-decoder, N-channels of the second local x-decoder and N-channels of the first local x-decoder.

2 Claims, 6 Drawing Sheets

LAYOUT STRUCTURE OF LOCAL X-DECODER

BACKGROUND OF THE INVENTION

1. Field of the Invention

This invention relates to local x-decoders, and more particularly, to a method and arrangement for implementing local x-decoders on an array.

2. Description of the Prior Art

A memory array can comprise a plurality of local x-decoders. Recent developments in the semiconductor field have increased the number of transistors used in a local x-decoder in order to reduce electrical fields across a first transistor, so a cell will not be selected during an erase operation.

Refer to FIG. 1A, which is a diagram of a conventional local x-decoder. Refer to FIG. 1B, which is a diagram of a Flash memory cell array comprising eight local x-decoders shown in FIG. 1A. As shown in the diagram, the eight local x-decoders are stacked on one side of an array. The eight word lines have a pitch of 512.

In the local x-decoder shown in FIG. 1A, P0 has a triple well, and an applied voltage of 9V. The word line is at 0V, meaning it cannot float. When the word line voltage PWL is greater than the bias voltage GWLb applied to the gate of P0, the transistor P0 will turn on. This means there will be an electric field across the transistor P0. After a number of cycles, the charge on the gate will be lost due to the presence of even a weak field. The programmed cell will therefore become an erase cell.

Refer to FIG. 2A, which is a diagram of a local x-decoder comprising extra transistors and signals. The presence of transistors P1 and P2 ensures that P0 has a 9V potential, and will therefore always be off. This means the word line is floating, and will follow the potential at the bottom of the well, meaning it can go as high as possible. The result is there is no electrical field across P0. In the circuit shown in FIG. 1A, the word line is floating, and will therefore follow the voltage applied to the gate.

During an erase operation, if the field across the transistor is as low as possible, this reduces the chance that P0 will be disturbed, meaning the Flash memory will remain a programmed cell. It is therefore preferable to have a memory cell array comprised of local x-decoders shown in FIG. 2A. The extra transistors P1 and P2, as well as signals required for these extra transistors, increases the area of the circuit. As the vertical pitch of a memory cell array is limited to approximately 2.47 nm, adding these extra transistors causes problems.

SUMMARY OF THE INVENTION

A two-sided memory array comprising a central Flash memory cell array according to an exemplary embodiment of the present invention is disclosed. Each side of the memory array comprises: four local x-decoders, each local x-decoder comprising: a first pair of cascode transistors coupled between a voltage supply and ground, comprising a first PMOS and a first NMOS, wherein a first voltage is coupled to a gate of the first PMOS and a gate of the first NMOS, and a first signal is coupled to a drain of the first PMOS and a source of the first NMOS; a second pair of cascode transistors comprising a second PMOS and a second NMOS, wherein a drain of the second NMOS is coupled to ground, a source of the second PMOS is coupled to a second signal, a drain of the second PMOS is coupled to a word line, and the first signal is coupled to a gate of the second PMOS; a third PMOS, having a source coupled to the first signal and a drain coupled to ground; and a third pair of cascode transistors comprising a third NMOS and a fourth NMOS, wherein a source of the third NMOS is coupled to the second signal, a gate of the third NMOS is coupled to a third signal, and a drain of the fourth NMOS is coupled to the word line. All transistors in each local x-decoder are disposed vertically, and P-channels and N-channels of the four local x-decoders on each side of the memory array are disposed in an order corresponding to P-channels of a first local x-decoder, P-channels of a second local x-decoder, P-channels of a third local x-decoder, P-channels of a fourth local x-decoder, N-channels of the fourth local x-decoder, N-channels of the third local x-decoder, N-channels of the second local x-decoder and N-channels of the first local x-decoder.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
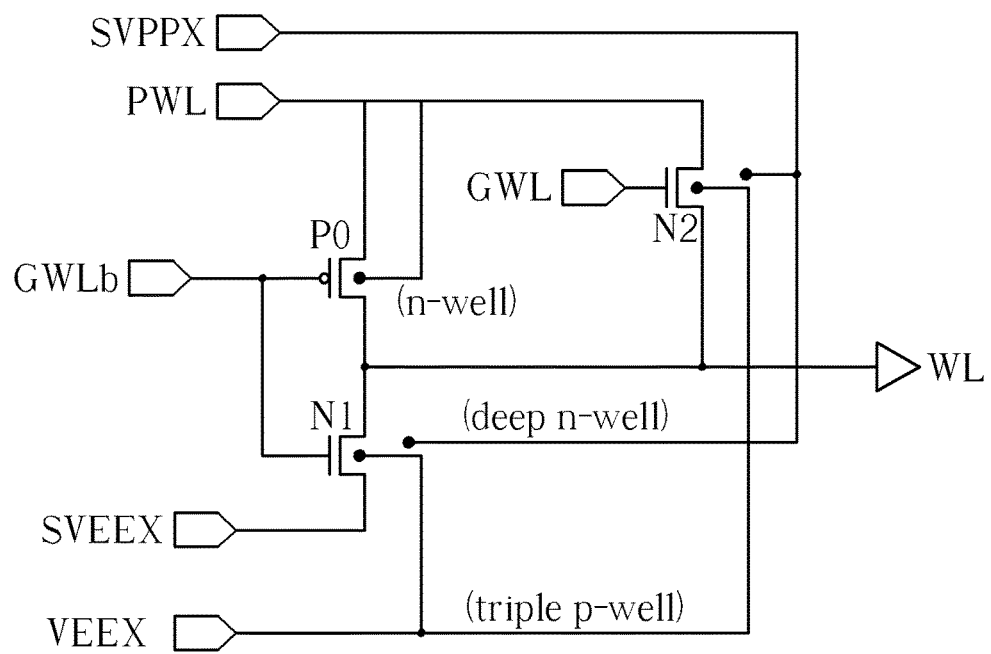
FIG. 1A is a diagram of a related art local x-decoder.
Figure 1B:
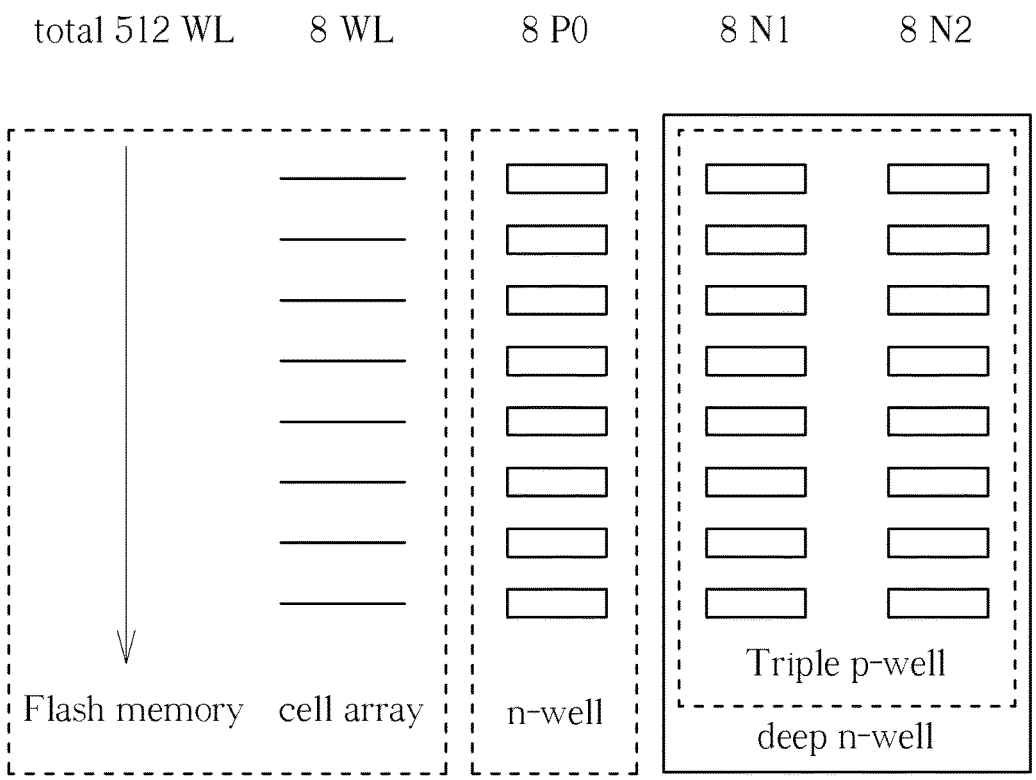
FIG. 1B is a side-on view of eight local x-decoders shown in FIG. 1A in a memory array.
Figure 2A:
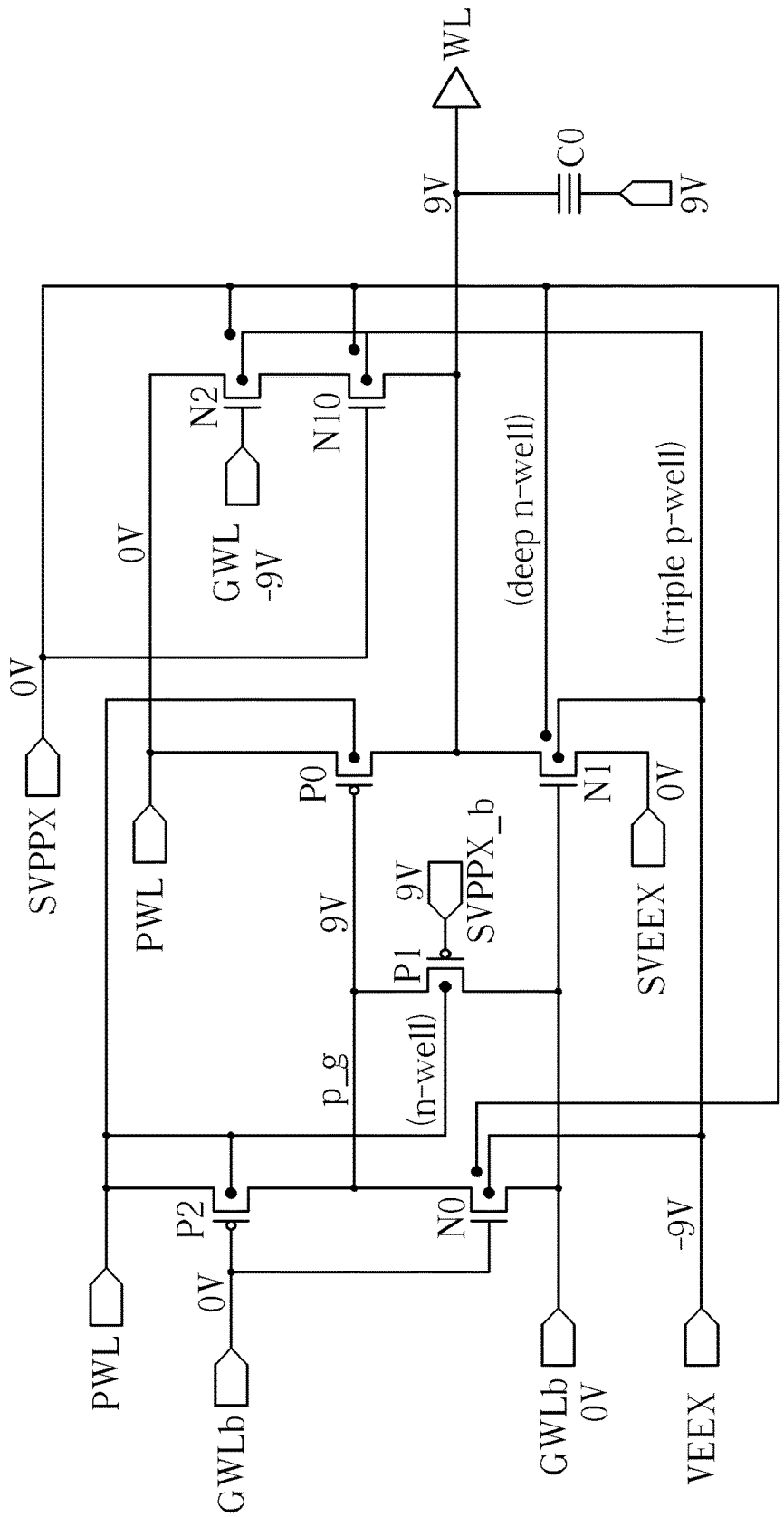
FIG. 2A is a diagram of a local x-decoder according to an exemplary embodiment of the present invention.
Figure 2B:
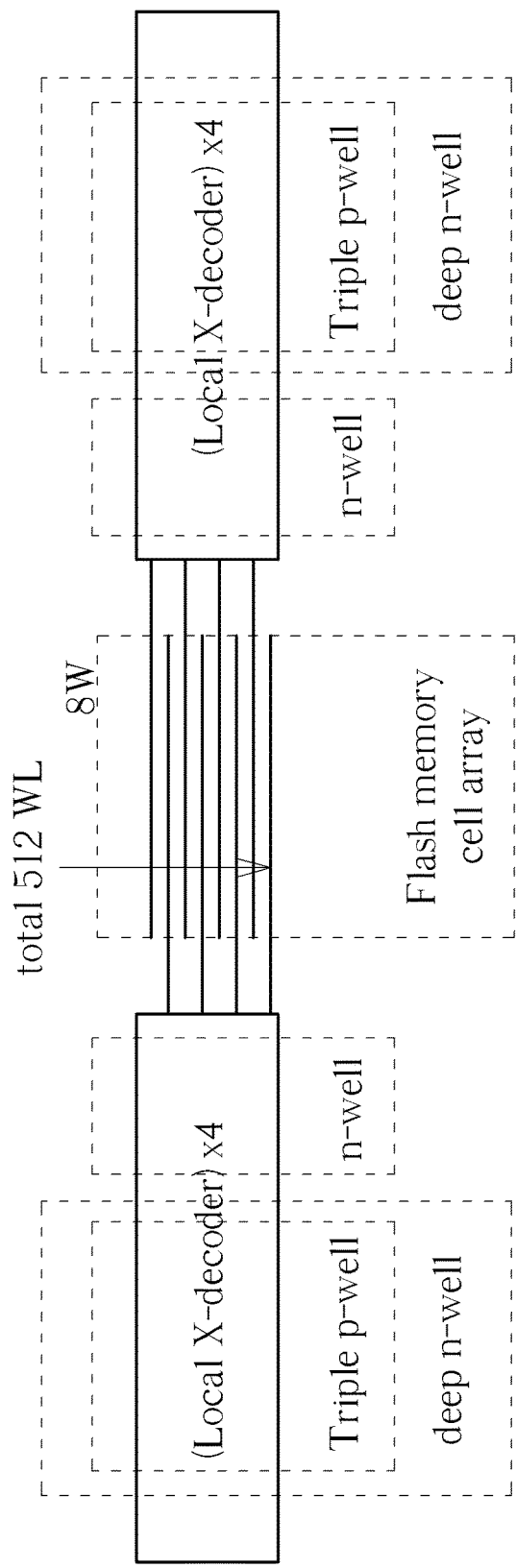
FIG. 2B is a side-on view of eight local x-decoders shown in FIG. 2A in a memory array.

Refer to FIG. 2B, which is a diagram of a Flash memory cell array comprising eight local x-decoders, wherein each local x-decoder is a local x-decoder as illustrated in FIG. 2A. As detailed in the background section, the circuit shown in FIG. 2A has a larger area than the circuit shown in FIG. 1A, due to the presence of extra transistors P1, P2 and N0 and their corresponding signals. The vertical pitch of a memory cell array is limited, meaning the local x-decoder shown in FIG. 2A cannot be implemented in a memory cell array in the way shown in FIG. 1B.

By rotating the transistor orientation from left-to-right to top-to-bottom—in particular, rotating the gates—the local x-decoder including extra transistors can be implemented on the memory array. This is because, although the vertical pitch must be kept as narrow as possible, the horizontal pitch is not limited at all. Rotating the transistors only increases the entire chip area by about 2% in the X direction with no increase in the Y direction.

Further, as shown in FIG. 2B, the eight local x-decoders can be divided into two groups of four, wherein each group is on one side of the array. The word lines run from left to right, wherein the four odd word lines ($1^{st}$, $3^{rd}$, $5^{th}$, $7^{th}$) connect to four respective local x-decoders on the left side of the array, and the four even word lines ($2^{nd}$, $4^{th}$, $5^{th}$, $8^{th}$) connect to four respective local x-decoders on the right side of the array.

Even with the above modifications, the connection between the circuit components still has some difficulties. As detailed in the background, having extra transistors in the local x-decoder requires three extra signals (wl, pwl and p_g). Each local decoder requires three extra signals (wl<3:0>, pwl<3:0> and p_g<3:0>); therefore, on each side of the array, twelve more signal lines are required, running horizontally. These lines must meet the geometrical design rule (GDR) which dictates a minimum metal width and space. In order to prevent shorting of these extra signal lines, the P and N channels need to be laid out a certain way. By arranging the channels in the order Pgroup0, Pgroup1, Pgroup2, Pgroup3, Ngroup3, Ngroup2, Ngroup1, Ngroup0 the connections can be made without electrical shorting.

Figure 3A:
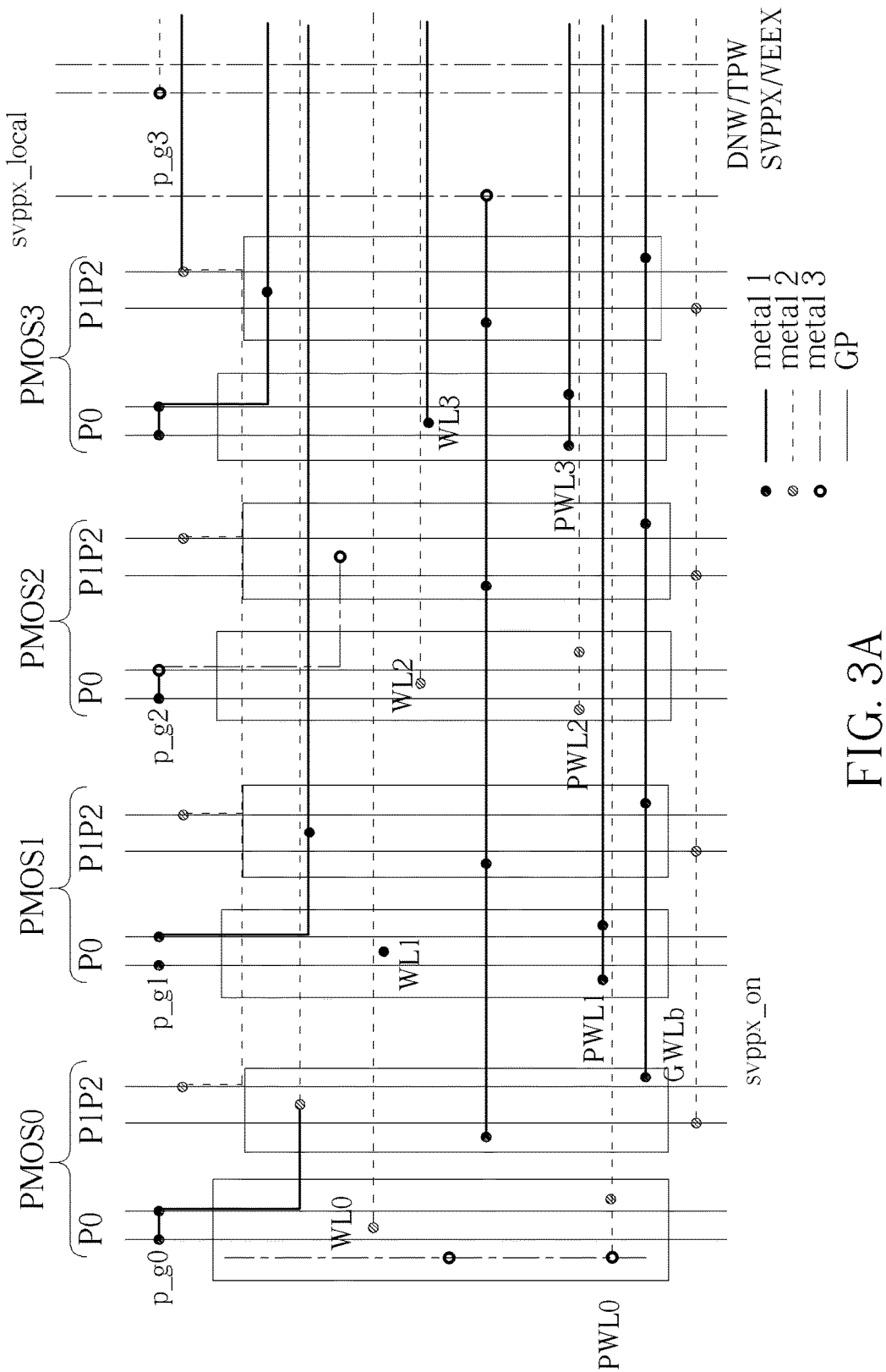
FIG. 3A is a diagram of the layout structure of the P channels of four local x-decoders shown in FIG. 2A, arranged on one side of a memory array.
Figure 3B:
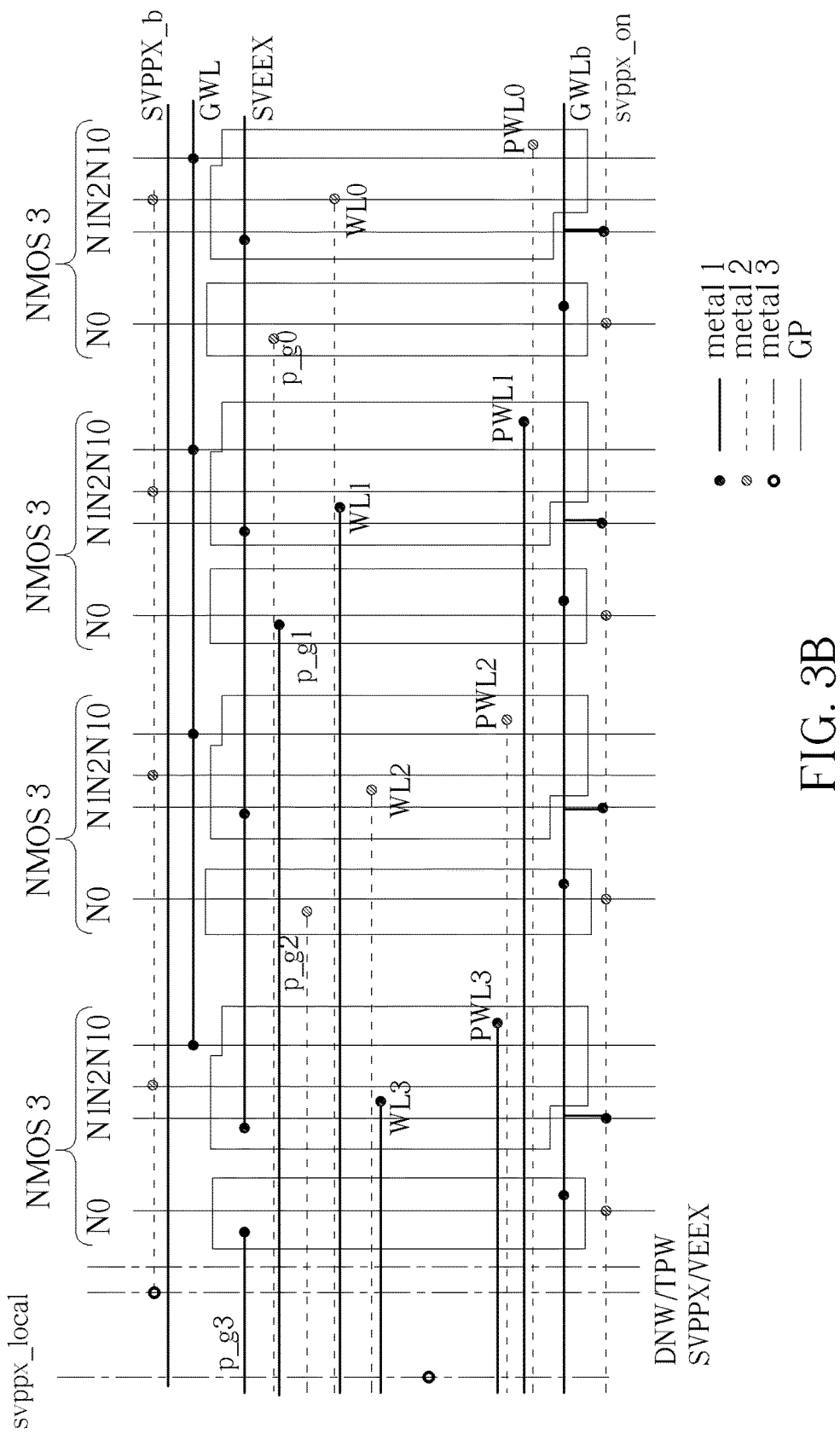
FIG. 3B is a diagram of the layout structure of the N channels of four local x-decoders shown in FIG. 2A, arranged on one side of a memory array.

Refer to FIG. 3A and FIG. 3B, which respectively show the layout structure of the P channels and N channels four local x-decoders shown in FIG. 2A, arranged on one side of a memory array. As shown in FIG. 3A, each local x-decoder has three P channels respectively corresponding to P0, P1 and P2; as shown in FIG. 3B, each local x-decoder has four N channels respectively corresponding to N0, N1, N2 and N10. P0 and N0 both have two channels, and therefore both have double the width of the other channels. Metal 1, represented by the bold solid line, connects to the gates of transistors P0 and to the diffusion channels. The connections are represented by dots. As the gates of P0 are isolated, they are outside the diffusion channels. Metal 2, represented by a dashed line, connects to a node and its own contact only to prevent shorting. The dots represent vias. Metal 3 is represented by the dotted and dashed line, wherein the dots also represent vias. The solid line represents the gates of the transistors.

By arranging the individual PMOS and NMOS groups in the order shown in FIG. 3A and FIG. 3B, the extra signal lines required by the local x-decoder shown in FIG. 2A can be run between P and N channels of four local x-decoders on one side of a memory array without the possibility of the signal lines shorting each other. In this way, the present invention provides an arrangement of eight local x-decoders that comprise extra transistors and signal lines which can meet geometrical design rules without increasing the vertical pitch.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A two-sided memory array comprising a central Flash memory cell array, wherein each side of the memory array comprises:

four local x-decoders, each local x-decoder comprising:
a first pair of cascode transistors coupled between a voltage supply and ground, comprising a first PMOS and a first NMOS, wherein a first voltage is coupled to a gate of the first PMOS and a gate of the first NMOS, and a first signal is coupled to a drain of the first PMOS and a source of the first NMOS;
a second pair of cascode transistors comprising a second PMOS and a second NMOS, wherein a drain of the second NMOS is coupled to ground, a source of the second PMOS is coupled to a second signal, a drain of the second PMOS is coupled to a word line, and the first signal is coupled to a gate of the second PMOS;
a third PMOS, having a source coupled to the first signal and a drain coupled to ground; and
a third pair of cascode transistors comprising a third NMOS and a fourth NMOS, wherein a source of the third NMOS is coupled to the second signal, a gate of the third NMOS is coupled to a third signal, and a drain of the fourth NMOS is coupled to the word line;

wherein all transistors in each local x-decoder are disposed vertically, and P-channels and N-channels of the four local x-decoders on each side of the memory array are disposed in an order corresponding to P-channels of a first local x-decoder, P-channels of a second local x-decoder, P-channels of a third local x-decoder, P-channels of a fourth local x-decoder, N-channels of the fourth local x-decoder, N-channels of the third local x-decoder, N-channels of the second local x-decoder and N-channels of the first local x-decoder.

2. The two-sided memory array of claim 1, wherein odd-numbered word lines of the local x-decoders couple the local x-decoders on a first side of the memory array to the central Flash memory and even-numbered word lines of the local x-decoders couple the local x-decoders on a second side of the memory array to the central Flash memory.

* * * * *